(12) United States Patent
Kudoh et al.

(10) Patent No.: US 10,991,933 B2
(45) Date of Patent: Apr. 27, 2021

(54) SECONDARY BATTERY

(71) Applicant: KABUSHIKI KAISHA NIHON MICRONICS, Tokyo (JP)

(72) Inventors: Takuo Kudoh, Tokyo (JP); Harutada Dewa, Tokyo (JP); Hikaru Takano, Tokyo (JP); Tomokazu Saito, Tokyo (JP); Takashi Tonokawa, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 108 days.

(21) Appl. No.: 16/322,398

(22) PCT Filed: Jul. 21, 2017

(86) PCT No.: PCT/JP2017/026386
§ 371 (c)(1),
(2) Date: Jan. 31, 2019

(87) PCT Pub. No.: WO2018/025654
PCT Pub. Date: Feb. 8, 2018

(65) Prior Publication Data
US 2020/0185701 A1    Jun. 11, 2020

(30) Foreign Application Priority Data
Aug. 1, 2016 (JP) .............. JP2016-151073

(51) Int. Cl.
*H01M 4/131* (2010.01)
*H01M 4/38* (2006.01)
(Continued)

(52) U.S. Cl.
CPC .......... *H01M 4/131* (2013.01); *H01M 4/387* (2013.01); *H01L 28/75* (2013.01); *H01M 10/36* (2013.01)

(58) Field of Classification Search
CPC ...... H01M 4/131; H01M 4/387; H01M 10/36; H01G 11/56; H01G 11/26; H01G 4/008;
(Continued)

(56) References Cited

U.S. PATENT DOCUMENTS

2008/0016681 A1 * 1/2008 Eisenring ............... H01G 11/26
29/623.1
2013/0224596 A1 * 8/2013 Nakazawa .......... H01M 14/005
429/220
(Continued)

FOREIGN PATENT DOCUMENTS

EP    2061049 A2    5/2009
EP    2860759 A1    4/2015
(Continued)

OTHER PUBLICATIONS

Shao et al., "High strength W/TiNi micro-laminated composite with transformation-mediated ductility," Available Online Jun. 6, 2016 , Materials and Design, 106, 415-419. (Year: 2016).*
(Continued)

*Primary Examiner* — Ula C Ruddock
*Assistant Examiner* — Matthew W Van Oudenaren
(74) *Attorney, Agent, or Firm* — McCoy Russell LLP

(57) ABSTRACT

A secondary battery according to the present invention includes a first electrode, a second electrode, a charging layer arranged between the first electrode (11) and the second electrode and containing a mixture of an insulating material and a first n-type oxide semiconductor material, an n-type oxide semiconductor layer arranged between the charging layer and the first electrode and containing a second n-type oxide semiconductor material, a p-type oxide semiconductor layer (16) arranged between the charging layer and the second electrode and containing a p-type oxide semiconductor material, a mixture layer arranged between
(Continued)

the charging layer and the p-type oxide semiconductor layer and containing a mixture of silicon oxide and a third n-type oxide semiconductor material, and a conductive layer arranged between the first electrode and the n-type oxide semiconductor layer and containing a metal material.

10 Claims, 1 Drawing Sheet

(51) Int. Cl.
    *H01L 49/02* (2006.01)
    *H01M 10/36* (2010.01)
(58) Field of Classification Search
    CPC ........... H01G 4/33; H01L 28/75; H01L 21/28; H01L 49/00
    See application file for complete search history.

(56) References Cited

U.S. PATENT DOCUMENTS

| | | | |
|---|---|---|---|
| 2014/0320108 A1 | 10/2014 | Dewa et al. | |
| 2015/0155608 A1* | 6/2015 | Kudoh | H01L 49/006 136/256 |
| 2015/0270580 A1* | 9/2015 | Habuta | H01G 11/84 429/144 |
| 2017/0098870 A1 | 4/2017 | Ogasawara et al. | |

FOREIGN PATENT DOCUMENTS

| | | |
|---|---|---|
| EP | 2953161 A1 | 12/2015 |
| JP | S6079775 A | 5/1985 |
| JP | 2016028408 A | 2/2016 |
| JP | 2016082125 A | 5/2016 |
| JP | 2016091931 A | 5/2016 |
| JP | 2016151073 A | 8/2016 |
| KR | 20090051596 A | 5/2009 |
| KR | 20140101337 A | 8/2014 |
| WO | 2013183132 A1 | 12/2013 |
| WO | 2015141107 A1 | 9/2015 |

OTHER PUBLICATIONS

Taiwan Intellectual Property Office, Office Action Issued in Application No. 106125722, dated Apr. 18, 2018, 8 pages.
European Patent Office, Extended European Search Report Issued in Application No. 17836760.3, dated Feb. 21, 2020, Germany, 8 pages.
ISA Japan Patent Office, International Search Report Issued in Application No. PCT/JP20171026386, dated Oct. 3, 2017, WIPO, 4 pages.
Korean Intellectual Property Office, Office Action Issued in Application No. 10-2019-7004267, dated Feb. 17, 2020, 10 pages. (Submitted with Machine Translation).

\* cited by examiner

SECONDARY BATTERY

CROSS REFERENCE TO RELATED APPLICATIONS

The present application is a U.S. National Phase of International Patent Application Serial No. PCT/JP2017/026386 entitled "SECONDARY BATTERY," filed on Jul. 21, 2017. International Patent Application Serial No. PCT/JP2017/026386 claims priority to Japanese Patent Application No. 2016-151073, filed on Aug. 1, 2016. The entire contents of each of the above-mentioned applications are hereby incorporated by reference in their entirety for all purposes.

TECHNICAL FIELD

The present invention relates to a technique for improving the performance of a secondary battery.

BACKGROUND ART

Patent Literature 1 discloses a power storage element including, between a first electrode and a second electrode, a power storage layer containing a mixture of an insulating material and n-type semiconductor particles. In addition, a p-type semiconductor layer is arranged between the power storage layer and the second electrode. Furthermore, a leakage suppression layer is arranged between the p-type semiconductor layer and the power storage layer. The leakage suppression layer is formed of at least one selected from silicon dioxide, aluminium oxide, or magnesium oxide.

Patent Literature 2 discloses a power storage element including, between a first electrode and a second electrode, a power storage layer containing a mixture of an insulating material and n-type semiconductor particles. In addition, a p-type semiconductor layer is arranged between the power storage layer and the second electrode. Furthermore, a diffusion suppression layer having the resistivity of 1000 $\mu\Omega \cdot cm$ or less is arranged between the first electrode and the power storage layer. The diffusion suppression layer is formed of nitride, carbide, and boride.

CITATION LIST

Patent Literature

Patent Literature 1: Japanese Unexamined Patent Application Publication No. 2016-82125
Patent Literature 2: Japanese Unexamined Patent Application Publication No. 2016-91931

SUMMARY OF INVENTION

Technical Problem

It has been desired to further improve the performance of secondary batteries. For example, when the leakage suppression layer in Patent Literature 1 is thickened to adequately obtain the leakage suppression effect, the charge transfer is restricted, and the performance of the battery is deteriorated. Alternatively, when the leakage suppression layer is thinned by using, for example, silicon dioxide as the material of the leakage suppression layer in order not to restrict the charge transfer, an uneven layer can be easily formed, which causes localized dielectric breakdown, and it is difficult to obtain desired performance of the battery.

The diffusion suppression layer in Patent Literature 2 is used to suppress the components of the substrate arranged under the first electrode or of the first electrode from diffusing in the power storage layer, and is not arranged to prevent oxidation of the surface of the first electrode. That is, oxidation of the surface of the first electrode cannot be prevented in Patent Literature 2, and the oxidation increases the electric resistance between the first electrode and the power storage layer. Accordingly, it is difficult to obtain desired performance of the battery.

The present invention has been made in view of the above problems, and to provide a technique for improving the performance of a secondary battery.

Solution to Problem

A secondary battery according to an aspect of the present embodiment includes a first electrode, a second electrode, a charging layer arranged between the first electrode and the second electrode and containing a mixture of an insulating material and a first n-type oxide semiconductor material, an n-type oxide semiconductor layer arranged between the charging layer and the first electrode and containing a second n-type oxide semiconductor material, a p-type oxide semiconductor layer arranged between the charging layer and the second electrode and containing a p-type oxide semiconductor material, a mixture layer arranged between the charging layer and the p-type oxide semiconductor layer and containing a mixture of silicon oxide and a third n-type oxide semiconductor material, and a conductive layer arranged between the first electrode and the n-type oxide semiconductor layer and containing a metal material.

The third n-type oxide semiconductor material may be tin oxide.

The conductive layer may contain the same metallic element as a metallic element contained in the second n-type oxide semiconductor material.

The conductive layer may contain a metallic element having higher electric conductivity than electric conductivity of a metallic element contained in the second n-type oxide semiconductor material.

The second n-type oxide semiconductor material may be titanium oxide.

The conductive layer may include a titanium film provided to be in contact with the n-type oxide semiconductor layer.

The conductive layer may have a laminated structure including a tungsten film and the titanium film, and the tungsten film may be provided to be in contact with the first electrode.

The conductive layer may include a first metal film being in contact with the n-type oxide semiconductor layer, and a second metal film being in contact with the first electrode, in which the first metal film may contain the same metallic element as a metallic element contained in the second n-type oxide semiconductor material.

The second metal film may contain a metallic element having higher electric conductivity than electric conductivity of a metallic element contained in the second n-type oxide semiconductor material.

The mixture layer may have a thickness of 100 nm to 250 nm.

Advantageous Effects of Invention

According to the present invention, it is possible to provide a technique for improving the performance of a secondary battery.

DESCRIPTION OF EMBODIMENT

Hereinafter, an example of a secondary battery according to an embodiment of the present invention is described with reference to the drawings. The following is merely for describing a suitable embodiment of the present invention, and the technical scope of the present invention is not limited to the following embodiment.

Figure 1:
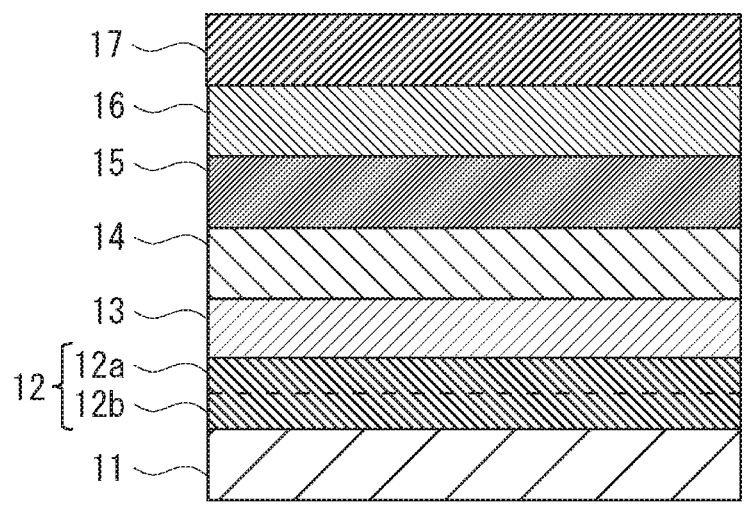
FIG. 1 is a diagram showing a laminated structure of a secondary battery.

With reference to FIG. 1, a laminated structure of a secondary battery 10 according to the present embodiment is described. FIG. 1 is a cross-sectional view schematically showing a structure of the secondary battery 10. The secondary battery 10 has a laminated structure in which a first electrode 11, a conductive layer 12, an n-type oxide semiconductor layer 13, a charging layer 14, a mixture layer 15, a p-type oxide semiconductor layer 16, and a second electrode 17 are laminated in this order.

The first electrode 11 is formed of a conductive sheet or a conductive substrate and serves as a base material for providing the laminated structure. For example, a metal foil sheet or the like can be used as the first electrode 11. In this description, a steel use stainless (SUS) sheet is used as the first electrode 11. Alternatively, a metal foil sheet made of copper, aluminium, or the like can be used as the first electrode 11.

In addition, by preparing a base material made of an insulating material, the first electrode 11 can be formed on the based material. In the case of the first electrode 11 to be formed on the base material, a metal material, such as chromium (Cr) or titanium (Ti), can be used as the material of the first electrode 11. An alloy film containing aluminium (Al), silver (Ag), or the like can be also used as the material of the first electrode 11. In the case of the first electrode 11 to be formed on the base material, the first electrode 11 can be formed similarly to the second electrode 17 to be described later.

The conductive layer 12 can be formed of a metal material. The conductive layer 12 has a single layer structure consisting of a first metal film 12a, or a double layer structure consisting of a first metal film 12a and a second metal film 12b. FIG. 1 shows the double layer structure consisting of the first metal film 12a and the second metal film 12b. In the case of the conductive layer 12 having the double layer structure, the second metal film 12b is in contact with the first electrode 11, and the first metal film 12a is in contact with the n-type oxide semiconductor layer 13. In the case of the conductive layer 12 having the single layer structure, the first metal film 12a is in contact with the n-type oxide semiconductor layer 13 and the first electrode 11.

The material of the first metal film 12a preferably contains the same metallic element as the n-type oxide semiconductor layer 13. For example, when the n-type oxide semiconductor layer 13 is titanium oxide (TiO2), the first metal film 12a is preferably titanium (Ti). In addition, the material of the first metal film 12a preferably contains an metallic element having higher electric conductivity than the electric conductivity of the metallic element contained in the n-type oxide semiconductor layer 13. For example, when the n-type oxide semiconductor layer 13 is titanium oxide (TiO2), the first metal film 12a is preferably titanium (Ti), an alloy containing titanium (Ti), aluminium (Al), an alloy containing aluminium (Al), chromium (Cr), or nickel (Ni).

The second metal film 12b preferably contains a metallic element having higher electric conductivity than, for example, the electric conductivity of the metallic element contained in the n-type oxide semiconductor layer 13. For example, when the n-type oxide semiconductor layer 13 is titanium oxide (TiO2), the second metal film 12b is preferably aluminium (Al) or tungsten (W).

The conductive layer 12 may have, for example, a single layer structure consisting of the first metal film 12a being a titanium (Ti) film or a double layer structure consisting of the first metal film 12a being a titanium (Ti) film and the second metal film 12b being a tungsten (W) film. The thickness of the conductive layer 12 is 15 nm to 300 nm. The conductive layer 12 can be formed on the first electrode 11 by sputtering or evaporation deposition.

The n-type oxide semiconductor layer 13 contains a second n-type oxide semiconductor material. As the material of the n-type oxide semiconductor layer 13, titanium dioxide (TiO2), tin oxide (SnO2), zinc oxide (ZnO), or the like can be used. The thickness of the n-type oxide semiconductor layer 13 is preferably 30 nm to 120 nm. For example, titanium oxide having the thickness of 60 to 120 nm can be used as the n-type oxide semiconductor layer 13. For example, the n-type oxide semiconductor layer 13 is formed on the first electrode 11 by sputtering or evaporation deposition.

The charging layer 14 is formed of a mixture of an insulating material and an n-type oxide semiconductor material. For example, as the n-type oxide semiconductor material (a first n-type oxide semiconductor material) of the charging layer 14, n-type oxide semiconductor fine particles can be used. The n-type oxide semiconductor is turned into a layer having a charging function because the optical excitation structure is changed by irradiation with a ultraviolet ray. The n-type oxide semiconductor contains a mixture of an n-type oxide semiconductor material and an insulating material. As the insulating material, silicone resin is can be used. For example, a silicon compound (silicone), such as silicon oxide, having a main skeleton by a siloxane bond is preferably used as the insulating material.

For example, the charging layer 14 is formed of silicon oxide and titanium dioxide which is used as the first n-type oxide semiconductor material. Besides, tin oxide (SnO2) or zinc oxide (ZnO) is suitable for the n-type oxide semiconductor material to be used for the charging layer 14. A material obtained by mixing two of titanium dioxide, tin oxide, and zinc oxide or all of them can be also used.

A manufacturing process of the charging layer 14 is described below. First, a coating liquid is prepared by mixing, into a solvent, a mixture of a precursor of titanium oxide, tin oxide, or zinc oxide and silicone oil. A coating liquid is prepared by mixing fatty acid titanium and silicone oil into a solvent. Then, the coating liquids are applied on the n-type oxide semiconductor layer 13 by a spin coating method, a slit coating method, or the like. The coating film is dried and calcined to form the charging layer 14 on the n-type oxide semiconductor layer 13. Note that, as an example of the precursor, for example, titanium stearate which is a precursor of titanium oxide can be used. Titanium oxide, tin oxide, and zinc oxide are formed by decomposing aliphatic acid salt which is a precursor of metal oxide. The charging layer 14 after drying and calcining may be irradiated with a ultraviolet ray to be UV-cured.

Note that, it is also possible to use, instead of a precursor, oxide semiconductor fine particles for titanium oxide, tin oxide, zinc oxide, or the like. Nanoparticles of titanium oxide or zinc oxide are mixed with silicone oil to obtain a liquid mixture. Then, the liquid mixture is mixed into a solvent to obtain a coating liquid. The coating liquid is applied on the n-type oxide semiconductor layer 13 by a spin coating method, a slit coating method, or the like. The coating film is dried, calcined, and UV-cured to form the charging layer 14.

The mixture layer 15 is formed of a mixture of an insulating material and an n-type oxide semiconductor material. As the material of the insulating material, silicon oxide can be used. For example, when the insulating material is silicon oxide, the mixture layer 15 contains silicon dioxide ($SiO_2$). The insulating material of the mixture layer 15 may be the same material as the insulating material of the charging layer 14.

As the material of the n-type oxide semiconductor material, tin oxide (SnO) can be used. In this case, the mixture layer 15 contains a mixture of silicon oxide and tin oxide. In the mixture layer 15, the n-type oxide semiconductor material is added to silicon oxide, silicon nitride, or silicone oil. The n-type oxide semiconductor is diffused in silicon dioxide which is the insulating material.

The first n-type oxide semiconductor material contained in the charging layer 14 may be the same as or different from the second n-type oxide semiconductor material contained in the n-type oxide semiconductor layer 13. For example, when the n-type oxide semiconductor material contained in the mixture layer 15 is tin oxide, the n-type oxide semiconductor material contained in the charging layer 14 may be tin oxide or another n-type oxide semiconductor material except for tin oxide.

The thickness of the charging layer 14 is, for example, 200 nm to 1000 nm, and the thickness of the mixture layer 15 is 100 nm to 150 nm. The mixture layer 15 can be formed to have the thickness of 50 nm to 250 nm. More preferably, the mixture layer 15 may be formed to have the thickness of 150 nm to 200 nm.

The mixture layer 15 can be formed in a similar manufacturing process to that for the charging layer 14. First, a coating liquid is prepared by mixing, into a solvent, a mixture of a precursor of tin oxide and silicone oil. Then, the coating liquid is applied on the charging layer 14 by a spin coating method, a slit coating method, or the like. The coating film is dried and calcined to form the mixture layer 15 on the charging layer 14. Tin oxide is formed by decomposing aliphatic acid which is a precursor of oxide semiconductor. The mixture layer 15 after drying and calcining may be irradiated with a ultraviolet ray to be UV-cured.

Note that, it is also possible to use, instead of a precursor, oxide semiconductor fine particles for the oxide semiconductor material. Nanoparticles of tin oxide are mixed with silicone oil to obtain a liquid mixture. Then, the liquid mixture is mixed into a solvent to obtain a coating liquid. The coating liquid is applied on the charging layer 14 by a spin coating method, a slit coating method, or the like. The coating film is dried, calcined, and UV-cured to form the mixture layer 15.

The p-type oxide semiconductor layer 16 contains a p-type oxide semiconductor material. As the material of the p-type oxide semiconductor layer 16, nickel oxide (NiO), copper-aluminium oxide ($CuAlO_2$), or the like can be used. For example, the p-type oxide semiconductor layer 16 is a nickel oxide film having the thickness of 400 nm. The p-type oxide semiconductor layer 16 is formed on the mixture layer 15 by a film forming method such as sputtering or evaporation deposition.

The second electrode 17 is only required to be formed of a conductive film. As the material of the second electrode 17, a metal material, such as chromium (Cr) or copper (Cu), can be used. Besides, a silver (Ag) alloy containing aluminium (Al) is also used. A forming method of the second electrode 22 includes vapor deposition such as spattering, ion plating, electron beam deposition, vacuum deposition or chemical deposition. In addition, the metal electrode can be formed by an electrolytic plating method or an electroless plating method. The metal used for plating is generally copper, a copper alloy, nickel, aluminium, silver, gold, zinc, tin, or the like. For example, the second electrode 17 is an Al film having the thickness of 300 nm.

Effects of Invention

In the secondary battery 10 according to the present embodiment, the mixture layer 15 is arranged between the charging layer 14 and the p-type oxide semiconductor layer 16. The mixture layer 15 is formed of a mixture of silicon oxide and a third n-type oxide semiconductor material (a conductive material). In comparison with a layer formed only of silicon oxide (an insulating material), the electric conductivity of the layer in the secondary battery according to the present embodiment can be adjusted by a conductive material, and it is possible to secure a certain level of electric conductivity although the mixture layer 15 is thickened. That is, it is possible for the mixture layer 15 to have a desired thickness in the secondary battery according to the present embodiment. Accordingly, it is possible to improve the performance of the secondary battery 10.

In addition, since it is possible for the mixture layer 15 to have a desired thickness while a certain level of conductivity is secured, it is unnecessary to form a layer to be thin in order not to obstruct the charge transfer unlike a layer formed only of silicon oxide (an insulating material). Thus, it is possible to prevent an uneven layer from being formed. That is, it is possible to avoid failures, such as localized dielectric breakdown in an uneven layer, in the secondary battery according to the present embodiment.

Furthermore, the conductive layer 12 is arranged between the first electrode 11 and the n-type oxide semiconductor layer 13 in the secondary battery 10 according to the present embodiment. The conductive layer 12 has a single layer structure including a titanium (Ti) film as the first metal film 12a or a double layer structure including a titanium (Ti) film as the first metal film 12a and a tungsten (W) film as the second metal film 12b.

<Single Layer Structure>

When the conductive layer 12 has a single layer structure (the first metal film 12a), the conductive layer 12 containing a metal material (the metal material preferably contains the same metallic element as the metallic element contained in the n-type oxide semiconductor layer 13 or a metallic element having higher electric conductivity than that of the metallic element contained in the n-type oxide semiconductor layer 13) is arranged between the first electrode 11 and the n-type oxide semiconductor layer 13. For this reason, the current flows more easily from the first electrode 11 to the n-type oxide semiconductor layer 13 in comparison with the case where the conductive layer 12 is not arranged. That is, by arranging the conductive layer 12, the electric conductivity from the first electrode 11 to the n-type oxide semiconductor layer 13 can be adjusted. In addition, by arranging the conductive layer 12, it is possible to improve the adhesion between the first electrode 11 and the n-type oxide semiconductor layer 13.

When the surface of the first electrode 11 is oxidized without the conductive layer 12, the electric conductivity between the first electrode 11 and the charging layer 14 is lowered. By arranging the conductive layer 12 on the first electrode 11, it is possible to secure a certain level of electric conductivity while oxidation of the surface of the first electrode 11 is reduced.

When the n-type oxide semiconductor layer 13 is titanium oxide, the conductive layer 12 (the first metal film 12a) preferably includes a titanium film which is the same metallic element as that of the n-type oxide semiconductor layer 13. This titanium film secures a certain level of electric conductivity and serves as an adhesion layer improving the adhesion between the first electrode 11 and the n-type oxide semiconductor layer 13.

<Double Structure Layer>

When the conductive layer 12 has a double layer structure (the first metal film 12a and the second metal film 12b), it is possible to suppress migration of the heavy metal forming the first electrode 11 to the n-type oxide semiconductor layer 13 and to improve the adhesion between the layer arranged on the second metal film 12b and the layer arranged under the second metal film 12b, in addition to the effects (conductivity and adhesion) when the conductive layer 12 has the single layer structure. The details of these effects are described with reference to an example in which the second metal film 12b is tungsten, and the second n-type oxide semiconductor material contained in the n-type oxide semiconductor layer 13 is titanium oxide (that is, the n-type oxide semiconductor layer 13 contains titanium as the metallic element).

The electric resistivity of tungsten (W) is $5.29 \times 10^{-8}$ Ωm. The electric resistivity of titanium is $4.27 \times 10^{-7}$ Ωm. The electric resistivity is the reciprocal of the electric conductivity. That is, the metallic element contained in the second metal film 12b has higher electric conductivity than that of the metallic element contained in the second n-type oxide semiconductor material. In other words, by arranging the second metal film 12b, it is possible to secure electric conductivity between the first electrode 11 and the n-type oxide semiconductor layer 13. For example, although it can be possible to suppress migration by only arranging a layer having low electric conductivity, the resistance is too high to secure electric conductivity, and desired performance of the battery cannot be obtained. It is important to arrange a layer having higher electric conductivity than that of the metallic element contained in the second n-type oxide semiconductor material, as the second metal film according to the present embodiment.

By forming the conductive layer 12 being a titanium film to have the thickness of 15 nm, the n-type oxide semiconductor layer 13 being a TiO film to have the thickness of 60 nm, the charging layer 14 to have the thickness of 1000 nm, the mixture layer 15 to have the thickness of 150 nm, the p-type oxide semiconductor layer 16 being an NiO film to have the thickness of 400 nm, and the second electrode 17 being an Al film to have the thickness of 300 nm, it is possible to obtain high performance.

Figure 2:
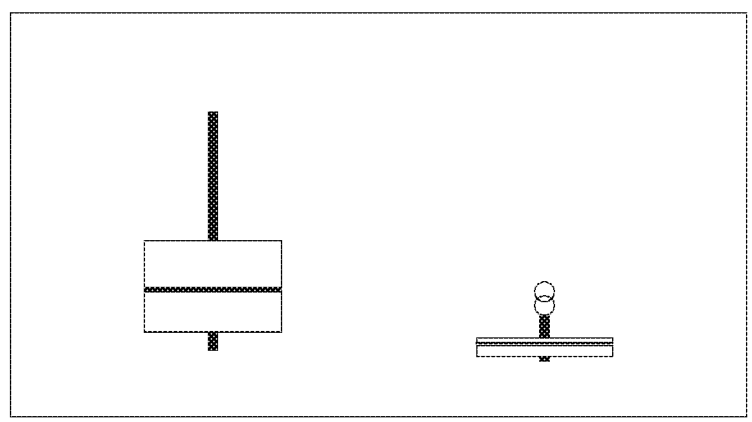
FIG. 2 is a graph showing the difference in energy density in the cases where a conductive layer is provided and is not provided.

FIG. 2 shows measurement results of energy density in the cases where the conductive layer 12 is provided and is not provided. A measurement result A indicates the measurement result of a secondary battery in which the conductive layer 12 is a titanium single layer. A measurement result B indicates the measurement result of a secondary battery in which the conductive layer 12 is not provided and the first electrode 11 is in contact with the n-type oxide semiconductor layer 13. Here, the n-type oxide semiconductor material of the n-type oxide semiconductor layer 13 is titanium oxide. In addition, FIG. 2 shows the measurement result of each secondary battery in which the thickness of the charging layer 14 is 200 nm and the thicknesses of other layers are changed.

Specifically, the measurement result A in FIG. 2 indicates the measurement result of the secondary battery satisfying the following (condition 1) to (condition 4).

(Condition 1) The thickness of the n-type oxide semiconductor layer 13 is changed in the range of 65 to 120 nm.

(Condition 2) The thickness of the mixture layer 15 is changed in the range of 100 to 250 nm.

(Condition 3) A SUS foil is used as the first electrode 11 and its thickness is changed in the range of 5 to 10 um.

(Condition 4) The conductive layer 12 is provided in the secondary battery and the thickness of the conductive layer 12 is changed in the range of 15 to 120 nm.

The measurement result B indicates the measurement result of the secondary battery satisfying the above (condition 1) to (condition 3). That is, the measurement result B shows the measurement result of the secondary battery in which the conductive layer 12 is not provided. In addition, the measurement result of a secondary battery in which the conductive layer 12 is a double layer using tungsten as the first metal film 12a and titanium as the second metal film 12b has been substantially the same as the measurement result A of the secondary battery in which the conductive layer 12 is a titanium single layer.

In each of the measurement results A and B in FIG. 2, the measurement values of the energy density in 15 samples are shown in a form of box plot. In the box plot form, the upper 25% and the lower 25% of the 15 samples are represented as boxes. The median of 15 samples is indicated by a thick horizontal line. The vertical axis indicates the energy density (Wh/l). Comparing the measurement result A in which the conductive layer 12 is provided with the measurement result B in which the conductive layer 12 is not provided, the measurement result A in which the conductive layer 12 is provided indicates that higher energy density is obtained.

Note that, the second metal film 12b may contain a metallic element having higher electric conductivity than the electric conductivity of the metallic element contained in the n-type oxide semiconductor layer 13 and having a higher work function than the electric conductivity of the metallic element contained in the n-type oxide semiconductor layer 13. For example, when the n-type oxide semiconductor layer 13 is titanium oxide ($TiO_2$), the second metal film 12b is preferably tungsten (W). Note that, the work function of tungsten (W) is 4.52 eV. The work function of titanium is 4.14 eV.

An example of an embodiment of the present invention has been described above, and the present invention includes appropriate modifications that do not harm its purposes and advantages and is not limited by the above embodiment.

This application is based upon and claims the benefit of priority of Japanese Patent Application No. 2016-151073 filed on Aug. 1, 2016, the disclosure of which is incorporated herein in its entirety by reference.

REFERENCE SIGNS LIST

10 Secondary battery
11 First electrode
12 Conductive layer

12a First metal film
12b Second metal film
13 N-type oxide semiconductor layer
14 Charging layer
15 Mixture layer
16 P-type oxide semiconductor layer
17 Second electrode

The invention claimed is:

1. A secondary battery comprising:
    a first electrode;
    a second electrode;
    a charging layer arranged between the first electrode and the second electrode and containing a mixture of an insulating material and a first n-type oxide semiconductor material;
    an n-type oxide semiconductor layer arranged between the charging layer and the first electrode and containing a second n-type oxide semiconductor material;
    a p-type oxide semiconductor layer arranged between the charging layer and the second electrode and containing a p-type oxide semiconductor material;
    a mixture layer arranged between the charging layer and the p-type oxide semiconductor layer and containing a mixture of silicon oxide and a third n-type oxide semiconductor material; and a conductive layer arranged between the first electrode and the n-type oxide semiconductor layer and containing a metal material.

2. The secondary battery according to claim 1, wherein the third n-type oxide semiconductor material is tin oxide.

3. The secondary battery according to claim 1, wherein the conductive layer contains the same metallic element as a metallic element contained in the second n-type oxide semiconductor material.

4. The secondary battery according to claim 1, wherein the conductive layer contains a metallic element having a higher electric conductivity than an electric conductivity of a metallic element contained in the second n-type oxide semiconductor material.

5. The secondary battery according to claim 1, wherein the second n-type oxide semiconductor material is titanium oxide.

6. The secondary battery according to claim 5, wherein the conductive layer includes a titanium film provided to be in contact with the n-type oxide semiconductor layer.

7. The secondary battery according to claim 6, wherein the conductive layer has a laminated structure including a tungsten film and the titanium film, and the tungsten film is provided to be in contact with the first electrode.

8. The secondary battery according to claim 1, wherein the conductive layer comprises:
    a first metal film being in contact with the n-type oxide semiconductor layer; and
    a second metal film being in contact with the first electrode, wherein the first metal film contains the same metallic element as a metallic element contained in the second n-type oxide semiconductor material.

9. The secondary battery according to claim 8, wherein the second metal film contains a metallic element having a higher electric conductivity than an electric conductivity of the metallic element contained in the second n-type oxide semiconductor material.

10. The secondary battery according to claim 1, wherein the mixture layer has a thickness of 100 nm to 250 nm.

* * * * *